United States Patent [19]
Nishiyama et al.

[11] Patent Number: 4,661,803
[45] Date of Patent: Apr. 28, 1987

[54] ANALOG/DIGITAL CONVERTER

[75] Inventors: Yoshihisa Nishiyama, Shizuoka; Noriyasu Fujii, Numazu, both of Japan

[73] Assignee: Tokyo Electric Co., Ltd., Tokyo, Japan

[21] Appl. No.: 854,200

[22] Filed: Apr. 21, 1986

[30] Foreign Application Priority Data

Apr. 27, 1985 [JP] Japan .................................. 60-91804

[51] Int. Cl.$^4$ ............................................. H03M 1/12
[52] U.S. Cl. ...................... 340/347 NT; 340/347 CC; 340/347 AD; 177/DIG. 3
[58] Field of Search .......... 177/DIG. 3; 340/347 NT, 340/347 CC;347 AD; 364/567, 568

[56] References Cited

U.S. PATENT DOCUMENTS

| 3,566,265 | 2/1971 | Reid | 340/347 CC |
| 3,978,471 | 8/1976 | Kelly | 340/347 NT |
| 4,031,533 | 6/1977 | Neumann | 340/347 NT |
| 4,294,322 | 10/1981 | Nishiyama | 177/DIG. 3 |

Primary Examiner—Charles D. Miller
Attorney, Agent, or Firm—Frishauf, Holtz, Goodman & Woodward

[57] ABSTRACT

An analog/digital converter has an integrator for integrating for a predetermined time a difference voltage (<VX) between a voltage equal to half a source voltage V1 and an input voltage VX supplied to the first input terminal after an initialization period, generating an output voltage increasing in proportion to the input voltage, and generating an output voltage decreasing at a predetermined rate after the predetermined time has elapsed, and a counter for generating count data until the output voltage from the integrator reaches a predetermined level. This converter also has a resistor-type voltage divider and a capacitor. The voltage divider is coupled between source terminals and generating from first and second output terminals first and second output voltages E1 and E2 which are lower than voltage V1/2. The capacitor has one terminal coupled to the first input terminal of the integrator and the other terminal coupled to the first and second output terminals of the resistor-type voltage divider through first and second switches. During initialization, the first switch closes and a voltage (E1−V1/2) is charged on the capacitor. After the predetermined period of time has elasped, the second switch is closed and a voltage (E1+E2−V1/2) is applied to the first input terminal of the integrator.

7 Claims, 7 Drawing Figures

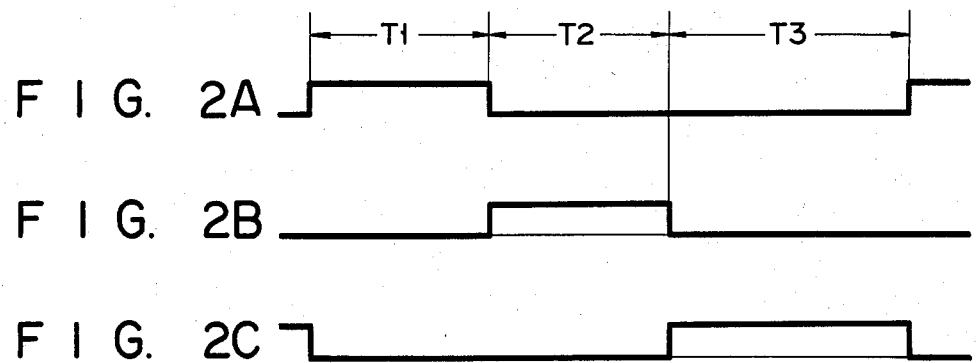
FIG. 2A
FIG. 2B
FIG. 2C
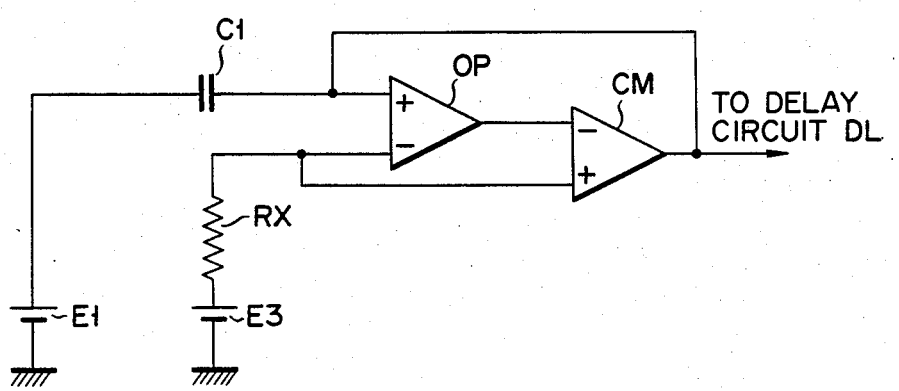
FIG. 3

ANALOG/DIGITAL CONVERTER

BACKGROUND OF THE INVENTION

The present invention relates to an analog/digital converter used, for example, in a digital scale with a load cell or the like.

In conventional analog/digital converters which include integrators and operate on a single DC power source voltage, a voltage equal to ½ the power source voltage is supplied as a reference voltage to the integrator. Hence, a voltage generator capable of generating a voltage equal to ½ the source voltage is necessary. A resistor type voltage divider is often used to constitute such a voltage generator. In order to keep down the power consumption of the voltage divider, however, its resistance is set at a relatively high value. The resistance of the voltage divider is set particularly high when a battery is used as the DC power source.

In this kind of A/D converter, using a simple resistor type voltage divider to generate a voltage equal to ½ source voltage VD, the impedance of the power source as viewed from the input side of the integrator is high, and the voltage VD/2 may fluctuate greatly. As a result, it has been impossible to construct a high-precision A/D converter.

SUMMARY OF THE INVENTION

It is an object of the present invention to provide an A/D converter which performs A/D conversion with high precision.

This object is achieved by an analog/digital converter comprising first and second source terminals; a first voltage divider, coupled between the first and second source terminals and generating a voltage having a value substantially half that of a source voltage; a second voltage divider, coupled between the first and second source terminals and generating from first and second output terminals first and second output voltages having values smaller than that of the output voltage from the first voltage divider; an input voltage terminal; an operation circuit having an integrator whose first input terminal is coupled to the input voltage terminal through a first switch and whose second input terminal is coupled to the output terminal of the first voltage divider, the operation circuit generating an end signal when an output voltage from the integrator becomes equal to the output voltage of the first voltage divider; a capacitor, having one terminal coupled to the first input terminal of the integrator; second and third switches, coupled between the other terminal of the capacitor and first and second output terminals of the second voltage divider; a fourth switch, coupled between the output terminal of the operation circuit and the first input terminal of the integrator; a counter for generating a first control signal for a first predetermined period of time and, after the first predetermined period of time has elapsed, generating a second control signal for a second predetermined period of time and, after the second predetermined period of time has elapsed, generating a third control signal and performing a counting operation until an end signal is generated by the operation circuit; and a switch driver, closing the second and fourth switches in response to the first control signal from the counter, closing the first switch in repsonse to the second control signal, and closing the third switch in response to the third control signal.

In the present invention, the difference voltage between the output voltage of the first voltage divider and the first output voltage of the second voltage divider can be stored by the capacitor in the initialization of the A/D conversion cycle. Hence, variations in the source voltage cannot affect the operation of the integrator.

BRIEF DESCRIPTION OF THE DRAWINGS

FIGS. 2A to 2C are signal timing charts explaining the operation of the A/D converter in FIG. 1;

FIG. 3 shows an equivalent circuit diagram for a portion of the A/D converter in FIG. 1 in an initialization process;

DETAILED DESCRIPTION OF THE PREFERRED EMBODIMENT

Figure 1:
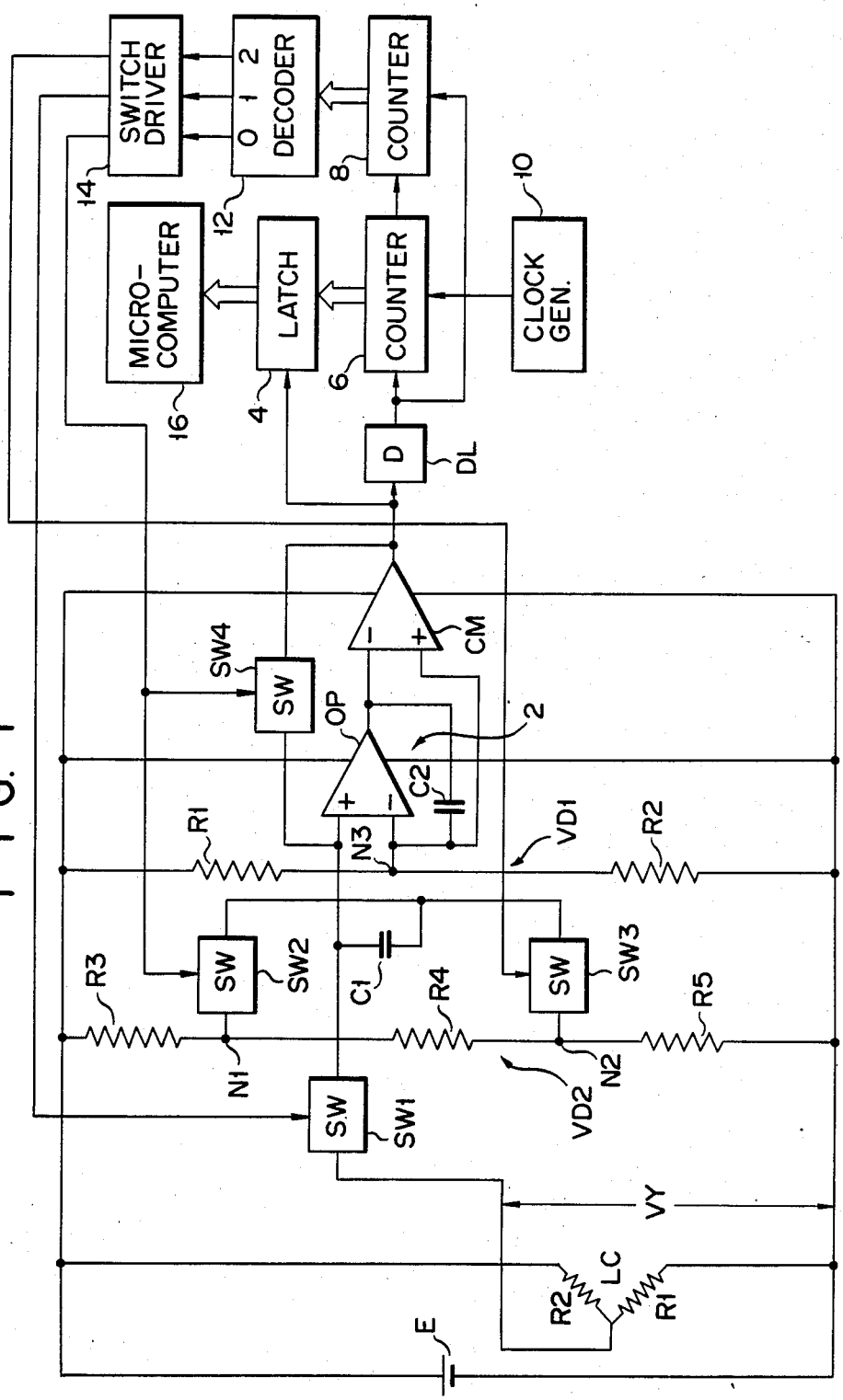
FIG. 1 is a schematic diagram of an analog/digital converter according to an embodiment of the present invention.

FIG. 1 is a schematic diagram of an A/D converter according to an embodiment of the present invention. This A/D converter has DC power source E for generating output voltage V1. In this embodiment, load cell LC having two strain gauge resistors of substantially the same resistance is coupled to power source E as an input voltage generator. Load cell LC generates voltage VY as given below when load Wx is applied:

$$VY = VX + E3 = (Wx/Wn) \cdot K \cdot V1 + E3 \qquad (1)$$

Where Wn is the rated load, and K is a constant.

Voltage divider VD1, comprising a series circuit of two resistors R1 and R2 having the same resistance, and voltage divider VD2, comprising a series circuit of resistors R3 to R5, are both coupled across the terminals of power source E. Voltage divider VD2 generates output voltages E1 and E2 (E1>E2) at node N1 between resistors R3 and R4 and at node N2 between resistors R4 and R5, respectively. Voltages E1 and E2 are set at a lower level than output voltage E3, generated at node N3 between resistors R1 and R2 of voltage divider VD1.

Node N3 of voltage divider VD1 is coupled to the inverting input terminal of operational amplifier OP. The non-inverting input terminal of amplifier OP is coupled to the output terminal of load cell LC through analog switch SW1. Nodes N1 and N2 of voltage divider VD2 are coupled through analog switches SW2 and SW3, respectively, to one terminal of capacitor C1. The other terminal of capacitor C1 is coupled to the non-inverting input terminal of amplifier OP. Amplifier OP cooperates with capacitor C2, coupled between the output terminal and inverting input terminal of amplifier OP, to constitute an integrator.

The output terminal of amplifier OP is coupled to the inverting input terminal of comparator CM. The non-inverting input terminal of comparator CM is coupled node N3 of voltage divider VD1. The output terminal of comparator CM is coupled to the non-inverting input terminal of amplifier OP through analog switch SW4. The output terminal of comparator CM is also coupled to latch 4 and to counters 6 and 8 through delay circuit DL. Counter 6 counts the clock pulses from clock generator 10, supplies count data to latch 4, and supplies a carry signal to counter 8 after, for example, every 10,000 pulses. The count data in counter 8 is supplied to decoder 12 for controlling switch driver 14. Driver 14 controls the ON/OFF operation of switches SW1 to SW4 in response to the control signal from decoder 12. Specifically, driver 14 sends drive signals to switches SW2 and SW4 in order to activate them in response to a "0" signal from decoder 12, as shown in FIG. 2A. Driver 14 sends drive signals to switches SW1 and SW3 to activate them in response to "1" and "2" signals from decoder 12, as shown in FIGS. 2B and 2C.

The digital data latched by latch 4 is supplied to microcomputer 16, where it is processed.

The operation of the A/D converter in FIG. 1 will be described below.

Suppose that, at time t1, the content of counter 6 is "0000", and the content of counter 8 is "0". In this case, decoder 12 generates a high level signal from its output terminal "0", causing switch driver 14 to supply high level drive signals to analog switches SW2 and SW4 and turn on these switches, as shown in FIG. 2A. FIG. 3 shows an equivalent circuit diagram of a portion of the A/D converter shown in FIG. 1 when these high level drive signals are supplied to switches SW2 and SW4. In this circuit, RX is equal to (R1·R2)/(R1+R2).

Figure 4:
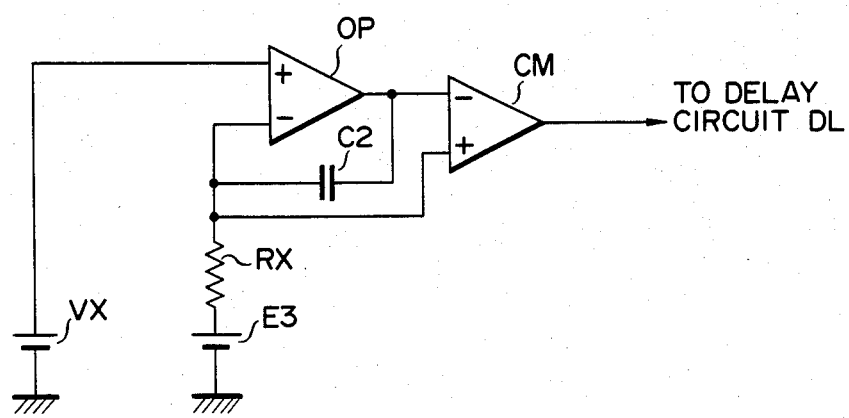
FIG. 4 shows an equivalent circuit diagram for a portion of the A/D converter in FIG. 1 in a reference period counting operation.

When the operation of the equivalent circuit in FIG. 3 is stabilized, signals at the inverting and non-inverting input terminals of amplifier OP become equal, and capacitor C1 is charged with voltage VC (=E3−E1). Thereafter, counter 6 continues to count clock pulses from clock generator 10. At time t2, when the content of counter 6 changes from "9999" to "0000", counter 6 supplies a carry signal to counter 8. Then, the content of counter 8 becomes "1", and decoder 12 generates a high level signal from its output terminal "1", causing switch driver 14 to send a high level drive signal to turn on switch SW1 as shown in FIG. 2B. FIG. 4 shows an equivalent circuit to a portion of the A/D converter in FIG. 1 while switch SW1 is ON. In this state, output voltage (VX+E3) is supplied from load cell LC to the non-inverting input terminal of amplifier OP. At time tx, output voltage V1, obtained by the following equation, is generated by integrator 2:

$$V1 = 1/(C2 \cdot RX) \int_{t2}^{tx} \{(VX + E3) - E3\} dt + VX + E3 \quad (2)$$

Voltage V1 rapidly rises to (VX+E3) level, and then increases with time.

When counter 6 completes the counting operation at time t3 and its content goes from "9999" to "0000", output voltage V11 from integrator 2 is given by the following equation:

$$V11 = 1/(C2 \cdot RX) \int_{t2}^{t3} \{(VX + E3) - E3\} dt + VX + E3 \quad (3)$$

$$= 1/(C2 \cdot RX) \cdot VX \cdot T2 + VX + E3$$

When the content of counter 6 reaches "0000" at time t3, the content of counter 8 changes from "1" to "2" in response to the carry signal from counter 6. As a result, decoder 12 sends a high level signal from its output terminal "2", causing switch driver 14 to send a high level switch drive signal to turn on switch SW3 as shown in FIG. 2C.

Figure 5:
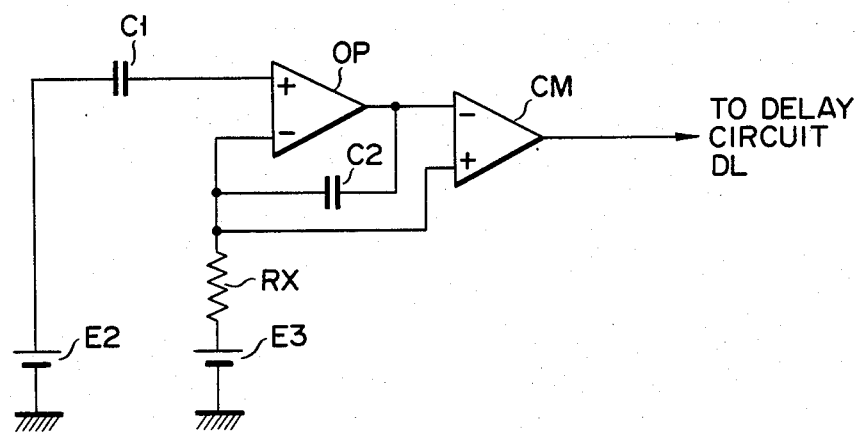
FIG. 5 shows an equivalent circuit diagram for a portion of the A/D converter in FIG. 1 during counting of a period whose length corresponds to an input voltage.

FIG. 5 shows an equivalent circuit diagram of a portion of the A/D converter in FIG. 1 while switch SW3 is ON. In this state, voltage E2+VC (<E3) is applied to the non-inverting input terminal of amplifier OP. Output voltage VY from integrator 2 is given at time ty by the following equation, in which only voltage V2 changes.

$$V2 = (1/C2 \cdot RX) \int_{t2}^{t1} (E2 + VC - E3) dt + (E2 + VC) \quad (4)$$

Voltage V2 rapidly drops by (E2+VC) and then gradually decreases at a constant rate. At time t4, V2 becomes equal to V1, and output voltage VY from integrator 2 becomes equal to E3. The output voltage from comparator CM becomes high, and latch 4, in response to the high level signal from comparator CM, latches the content of counter 6. In addition, counters 6 and 8 are reset in response to the signal supplied from comparator CM through delay circuit DL.

Since at time t4 output voltage VY from integrator 2 becomes equal to E3, the following equation can be obtained:

$$E3 = V11 + V21 = 1/(C2 \cdot RX) \int_{t2}^{t3} \{(VX + E3) - E3\} dt + \quad (5)$$

$$VX + E3 + 1/(C2 \cdot RX) \int_{t3}^{t4} (E2 + VC - E3) dt + (E2 + VC)$$

$$= 1/(C2 \cdot RX) \cdot VX \cdot T2 + VX + E3 +$$

$$1/(C2 \cdot RX) \cdot (E2 + VC - E3) \cdot T3 + (E2 + VC)$$

When VC=(E3−E1) is substituted in equation (5), the following equation can be obtained:

$$T3 = \frac{Vx}{VR} \cdot (T2 + C2 \cdot RX) - \frac{C2 \cdot RX}{VR} \cdot (VR - E3) \quad (6)$$

for, VR=E2−E1.

Since VR and E3 in equation (6) change in proportion to the variation of source voltage V1, the following equations can be obtained:

$$VR = k1 \cdot V1 \quad (7)$$

$$E3 = k2 \cdot V1 \quad (8)$$

By substituting equations (1), (7), and (8) in equation (6), the following equation can be obtained:

$$T3 = \frac{K}{k1} \cdot (Wx/Wn) \cdot (T2 + C2 \cdot RX) - \quad (9)$$

$$\frac{C2 \cdot RX}{k1} \cdot (k1 - k2)$$

Since C2, RX, T2, Wn, K, k1, and k2 in equation (9) are all constants, T3 changes in direct proportion with load Wx and is not affected by variations in voltage V1. In other words, latch 4 can respond with precision to load Wx and latch the count data.

As described above, in the circuit shown in FIG. 1, voltage V1/2 from voltage divider VD1 is used as a reference voltage in integrator 2. Since capacitor C1 is charged by voltage VC ($=E1-E3$) during initialization period T1 of each A/D conversion cycle, variations in source voltage V1 as viewed from the input side of integrator 2 are corrected by capacitor C1. Hence, high-precision A/D conversion can be performed without hindrance by variations in source voltage V1.

An embodiment of the present invention was described above, but the present invention is not limited to this. In the above embodiment, for example, the output voltage from load cell LC, driven by power source E, is used as input voltage VX. It is also possible, however, to use as input voltage VX an output voltage from a load cell or the like driven by a power source other than source E.

In the embodiment described above, T1 was set equal to T2. However, if voltage VC ($=E3-E1$) is charged to capacitor C1 in the initialization process, T1 need not be set equal to T2.

What is claimed is:

1. An analog/digital converter, comprising:
   an input voltage terminal to which an input voltage is applied;
   first and second source terminals between which a source voltage is applied;
   a first voltage divider, coupled between said first and second source terminals and generating a voltage substantially equal to half the source voltage;
   a second voltage divider, coupled between said first and second source terminals and generating from first and second output terminals first and second output voltages lower than the output voltage from said first voltage divider;
   first to fourth switching means;
   operating means having an integrator which has a first input terminal coupled to an input voltage terminal through said first switching means, and a second input terminal coupled to an output terminal of said first voltage divider, said integrator integrating the difference voltage between the input voltages to said first and second input terminals, said operating means generating an end signal when the output voltage from said integrator becomes equal to the output voltage from said first voltage divider, an output terminal of said operating means being coupled to said first input terminal of said integrator through said fourth switching means;
   capacitive means, having one terminal coupled to said first input terminal of said integrator and the other terminal coupled to said first and second output terminals of said second voltage divider through said second and third switching means, respectively;
   counting means for generating a first control signal for a first predetermined period of time and, after the first predetermined period has elapsed, generating a second control signal for a second predetermined period of time and, after the second predetermined period has elapsed, generating a third control signal and performing a counting operation until the end signal is generated by said operating means; and
   switch driving means for turning on said second and fourth switching means in response to the first control signal from said counting means, turning on said first switching means in response to the second control signal, and turning on said third switching means in response to the third control signal.

2. An analog/digital converter according to claim 1, wherein said integrator comprises an operational amplifier, having a first input terminal coupled to said input voltage terminal through said first switching means and a second input terminal coupled to said output terminal of said first voltage divider, and capacitive means, coupled between an output terminal and said second input terminal of said operational amplifier, and said operating means further has a comparator for comparing the output voltage from said integrator with the output voltage from said first voltage divider and generating an end signal when it is detected that the output voltage from said integrator becomes equal to the output voltage from said first voltage divider.

3. An analog/digital converter according to claim 2, wherein said counting means comprises a clock generator, a counter for counting clock pulses from said clock generator during said second predetermined period of time, stopping the generation of said second control signal when a predetermined count is reached, and counting clock pulses from said clock generator until an end signal is generated from said operating means, and a latch for latching the count data of said counter in response to the end signal from said operating means.

4. An analog/digital converter according to claim 3, wherein said first and second voltage dividers are resistor-type voltage dividers.

5. An analog/digital converter according to claim 4, wherein said input voltage changes in response to variations in a source voltage.

6. An analog/digital converter according to claim 2, wherein said first and second voltage dividers are resistor-type voltage dividers.

7. An analog/digital converter according to claim 1, wherein said first and second voltage dividers are resistor-type voltage dividers.

* * * * *